United States Patent [19]
Jeong

[11] Patent Number: 6,069,838
[45] Date of Patent: May 30, 2000

[54] SEMICONDUCTOR MEMORY DEVICE HAVING SUB-WORD LINE DRIVING CIRCUIT

[75] Inventor: Jae-Hong Jeong, Seoul, Rep. of Korea

[73] Assignee: LG Semicon Co., Ltd., Cheongju, Rep. of Korea

[21] Appl. No.: 09/280,065

[22] Filed: Mar. 29, 1999

[30] Foreign Application Priority Data

Dec. 9, 1998 [KR] Rep. of Korea ............... 98/53909

[51] Int. Cl.[7] ........................................ G11C 8/00
[52] U.S. Cl. ........................ 365/230.06; 365/51; 365/63; 365/230.03
[58] Field of Search ............................. 365/230.06, 51, 365/63, 230.03

[56] References Cited

U.S. PATENT DOCUMENTS 5,781,498  7/1998  Suh ............................ 365/230.06
5,835,439 11/1998  Suh ............................ 365/230.06
5,943,289  8/1999  Ahn et al. .................... 365/230.06
5,966,341 10/1999  Takahashi et al. ........... 365/230.03
5,970,003 10/1999  Miyatake et al. ............ 365/200

*Primary Examiner*—David Nelms
*Assistant Examiner*—Hien Nguyen
*Attorney, Agent, or Firm*—Fleshner & Kim, LLP

[57] ABSTRACT

A semiconductor memory device having a sub-word line driving circuit overcoming disadvantages of a conventional semiconductor memory device having a sub-word line driving circuit in that it requires additional NMOS transistors with their gates applied with a predecoding signal in order to connect all sub-word lines to the ground which may be floated during the operation of the sub-word line driving circuit, and thus a layout of the device is complicated and a size of the memory chip is increased, can simplify the device layout and reduce the memory chip size by using the NMOS transistor connecting the adjacent sub-word lines which are applied with an identical predecoding signal but receive different inverted global word line enable signals.

6 Claims, 5 Drawing Sheets

SEMICONDUCTOR MEMORY DEVICE HAVING SUB-WORD LINE DRIVING CIRCUIT

BACKGROUND OF THE INVENTION

1. Field of the Invention

The present invention relates to a semiconductor memory device having a sub-word line driving circuit, and in particular to a semiconductor memory device having a sub-word line driving circuit which can simplify a layout thereof and reduce a size of a memory chip by decreasing the number of additional NMOS transistors for connecting sub-word lines to a ground.

2. Description of the Background Art

In general, a semiconductor memory device includes: a decoder decoding an inputted address signal; and a sub-word line driving circuit driving a sub-word line to store a data in a specific memory cell or output the data stored in the memory cell through a bit line according to an output signal from the decoder. The semiconductor memory device having the sub-word line driving circuit will now be described in detail with reference to the accompanying drawings. Here, the semiconductor memory device including eight sub-word lines are exemplified. However, the number of the sub-word lines may be varied, if necessary.

FIG. 1 is a block diagram illustrating a conventional semiconductor memory device having a sub-word line driving circuit. As shown in FIG. 1, the semiconductor memory device includes: a row decoder 10 receiving high significant predecoding signals P4–Px obtained by predecoding externally-inputted high significant row address signals and outputting inverted first and second global word line enable signals GWLB0, GWBL1; a first sub-word line driving unit 20 selectively outputting first and second low significant predecoding signals P0, P1 obtained by predecoding externally-inputted low significant row address signals or a ground potential to corresponding sub-word lines according to the inverted first and second global word line enable signals GWLB0, GWLB1 and inverted first and second low significant predecoding signals PB0, PB1; a second sub-word line driving unit 30 selectively outputting third and fourth low significant predecoding signals P2, P3 obtained by predecoding externally-inputted low significant row address signals or the ground potential to corresponding sub-word lines according to the inverted first and second global word line enable signals GWLB0, GWLB1 and inverted third and fourth low significant predecoding signals PB2, PB3; and a memory cell array 40 having a plurality of memory cells storing a data or outputting a stored data through bit lines BL0–BL3, the specific sub-word line being enabled according to the low significant predecoding signal selectively outputted from the first and second sub-word line driving units 20, 30.

Here, the first and second sub-word line driving units 20, 30 and the memory cell array 40 are provided in a single unit, and may be employed in multiple number, if necessary.

FIG. 2 is a detailed circuit diagram illustrating the first and second sub-word line driving units 20, 30 and the memory cell array 40 which are provided in a single unit in the conventional semiconductor memory device. As illustrated in FIG. 2, the first sub-word line driving unit 20 includes first to fourth sub-word line drivers SWLD11–SWLD14 selectively respectively outputting the first to fourth low significant predecoding signals P0–P3 or the ground potential to the corresponding sub-word lines SWL0, SWL2, SWL4, SWL6 according to the inverted first and second global wordline enable signals GWLB0, GWLB1 and the inverted first to fourth low significant predecoding signals PB0–PB3.

Here, the first sub-word line driver SWLD11 includes an inverter consisting of a first PMOS transistor PM11 and a first NMOS transistor NM11-1, the inverted first global word line enable signal GWLB0 being applied to a commonly-connected gate of the first PMOS and NMOS transistors PM11, NM11-1, the first low significant predecoding signal P0 being applied to a source of the first PMOS transistor PM11, a source of the first NMOS transistor NM11-1 being connected to the ground; and a second NMOS transistor NM11-2, a first global word line enable signal GWL0 being applied to its gate, its drain being connected to the first sub-word line SWL0, its source being connected to the ground. Here, the commonly-connected drain of the first PMOS and NMOS transistors PM11, NM11-1 are connected to the first sub-word line SWL0.

The second to fourth sub-word line drivers SWLD12–SWLD14 are identically constituted to the first sub-word line driver SWLD11, and selectively output the first and second low significant predecoding signals P0, P1 or the ground voltage respectively to the third, fifth and seventh sub-word lines SWL2, SWL4, SWL6 under the control of the inverted first or second global word line enable signal GWLB0, GWLB1 and the inverted first or second low significant predecoding signal PB0, PB1.

The second sub-word line driving unit 30 is identically constituted to the first sub-word line driving unit 20. That is, the first to fourth sub-word line drivers SWLD21–SWLD24 are identically constituted to the first to fourth sub-word line drivers SWLD11–SWLD14 of the first sub-word line driving unit 20, and selectively output the third and fourth low significant predecoding signals P2, P3 or the ground voltage to the corresponding sub-word lines SWL1, SWL3, SWL5, SWL7 under the control of the inverted first and second global wordline enable signals GWLB0, GWLB1 and the inverted third and fourth low significant predecoding signals PB2, PB3.

The memory cell array 40 includes the plurality of memory cells at intersecting points of the sub-word lines SWL0–SWL7 which are respectively connected to the sub-word line drivers SWDL11–SWLD14, SWLD21–SWDL24 of the first and second sub-word line driving units 20, 30 and the bit lines BL0–BL3.

Here, the number of the sub-word line drivers is increased according to the number of the memory cells, namely an increase of the number of the sub-word lines.

The operation of the conventional semiconductor memory device having the sub-word line driving circuit will now be described.

First, when receiving the high significant predecoding signals P4–Px obtained by predecoding the high significant row address signals, the row decoder 10 decodes the signals, thereby outputting the inverted first and second global word line enable signals GWLB0, GWLB1.

The low significant predecoding signals P0–P3 obtained by predecoding the low significant address signals and the inverted signals thereof PB0–PB3 are applied to the first and second sub-word line driving units 20, 30.

Here, for example, when the inverted first global word line enable signal GLWB0 is at a low level and the first predecoding signal P0 is at a high level in the row decoder 10, the first sub-word line driver SWLD11 of the first sub-word line driving unit 20 outputs the first predecoding signal P0 of high level to the first sub-word line SWL0, thus making it possible to perform a reading/writing operation of a data by the bit lines BL0–BL3 on the memory cells of the memory cell array 40 connected to the first sub-word line SWL0.

However, the inverted second to fourth low significant predecoding signals PB1–PB3 are all at a high level, and thus the second NMOS transistors NM12-2, NM21-2, NM22-2 of the sub-word line drivers SWLD12, SWLD21, SWLD22 are turned on. As a result, the other sub-word lines SWL1–SWL7 are connected to the ground, and the data stored in the memory cells ol the memory cell array 40 connected to the corresponding sub-word lines SWL1–SWL3 are maintained.

In addition, the inverted second global word line enable signal GWLB1 is at a high level, and thus the fifth to eighth sub-word lines SWL4–SWL7 are connected to the ground by the first NMOS transistors NM13-1, NM14-1, NM23-1, NM24-1 of the sub-word line drivers SWLD13, SWLD14, SWLD23, SWLD24 connected to the sub-word lines SWL4–SWL7, regardless of the first to fourth low significant predecoding signals P0–P3. Therefore, the data stored in the memory cells of the memory cell array 40 connected to the fifth to eighth sub-word lines SWL4–SWL7 are maintained.

Identically, the sub-word lines SWL0–SWL7 may be selected and enabled by selecting and applying the inverted first and second global word line enable signals GWLB0–GWLB1 and the first to fourth low significant predecoding signals P0–P3. Thus, it makes it possible to selectively write a data on a preferable memory cell of the memory cell array 40 or read a data stored therein.

However, when the conventional semiconductor memory device is operated, the sub-word line driving units 20, 30 require the additional NMOS transistors for connecting the sub-word lines which may be floated to the ground. There are disadvantages of the conventional semiconductor memory device in that the layout thereof is complicated and a size of the memory chip is increased.

SUMMARY OF THE INVENTION

It is therefore an object of the present invention to provide a semiconductor memory device having a sub-word line driving circuit which can simplify a layout thereof and reduce a memory chip size by diminishing the number of additional NMOS transistors for connecting sub-word lines to the ground.

In order to achieve the object of the present invention, there is provided a semiconductor memory device having a sub-word line driving circuit, including: a plurality of sub-word line driving units each including a plurality of inverters, each receiving at its input a global word line signal from a row decoder being connected to their input terminals, and a predecoding signal obtained by predecoding an external low significant row address signal being connected to their power terminals, with their output terminals being connected to sub-word lines, and a plurality of transistors, a channel of each of which being connected between a respective pair of adjacent sub-word lines receiving an identical decoding signal and a control terminal of each of which the inverters receiving an inverted row decoding signal, and controlled by the inverted row decoding signal.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

A semiconductor memory device having a sub-word line driving circuit according to a preferable embodiment of the present invention will now be described in detail with reference to the accompanying drawings.

Figure 1:
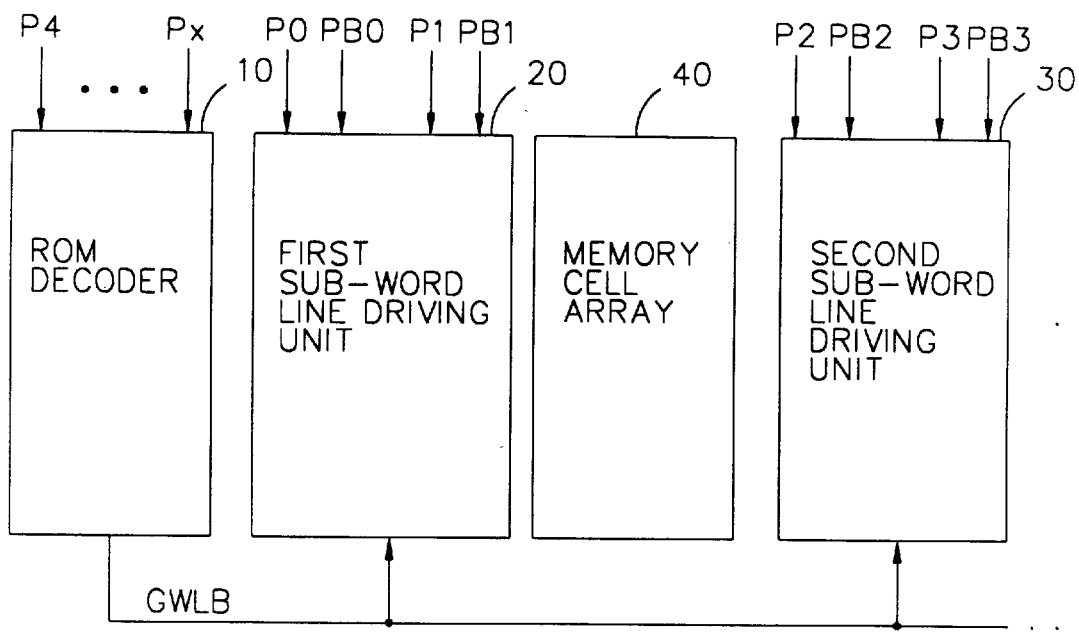
FIG. 1 is a block diagram illustrating a conventional semiconductor memory device having a sub-word line driving circuit.
Figure 2:
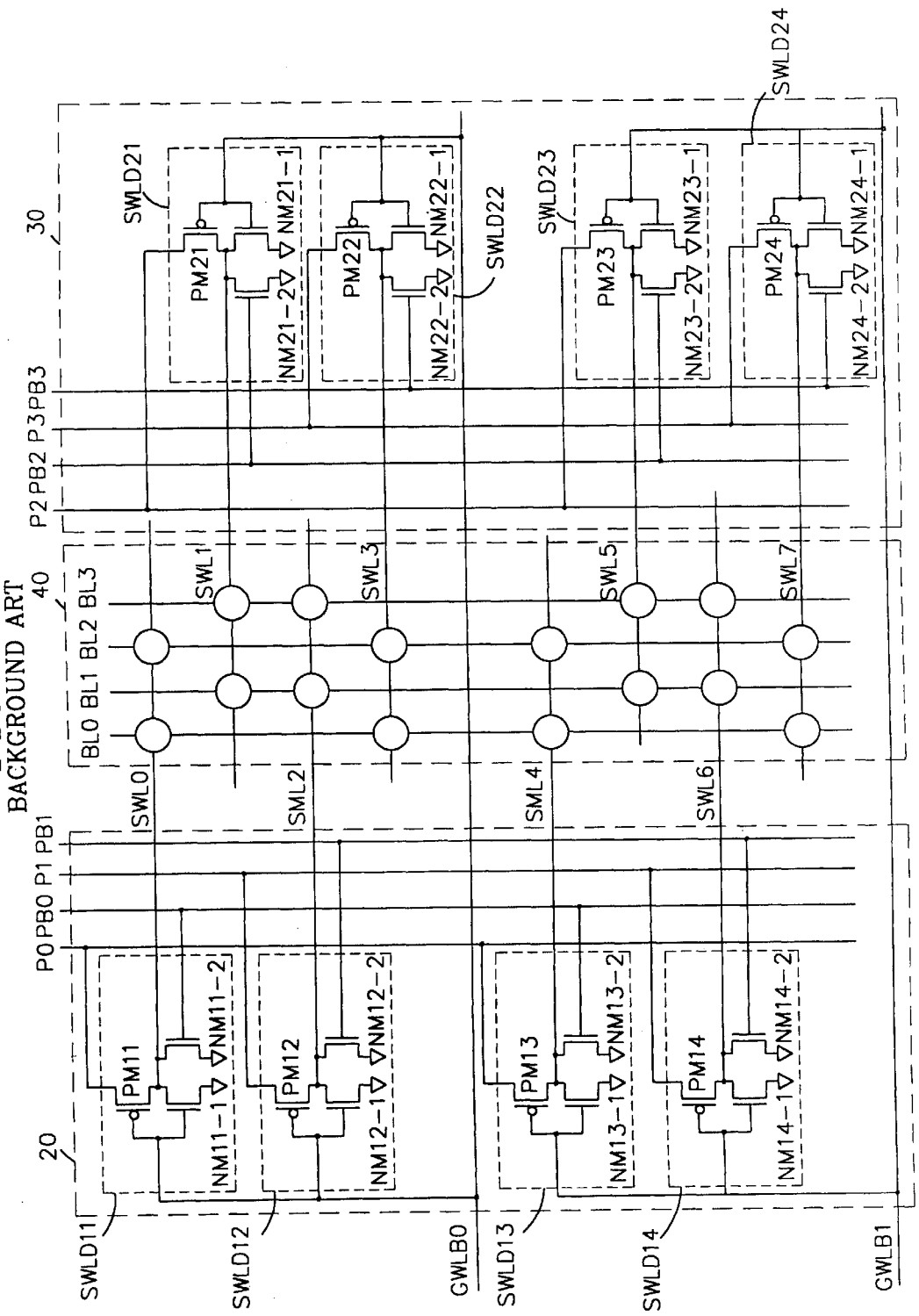
FIG. 2 is a detailed circuit diagram illustrating first and second sub-word line driving units and a memory cell array of the conventional semiconductor memory device in FIG. 1.
Figure 3:
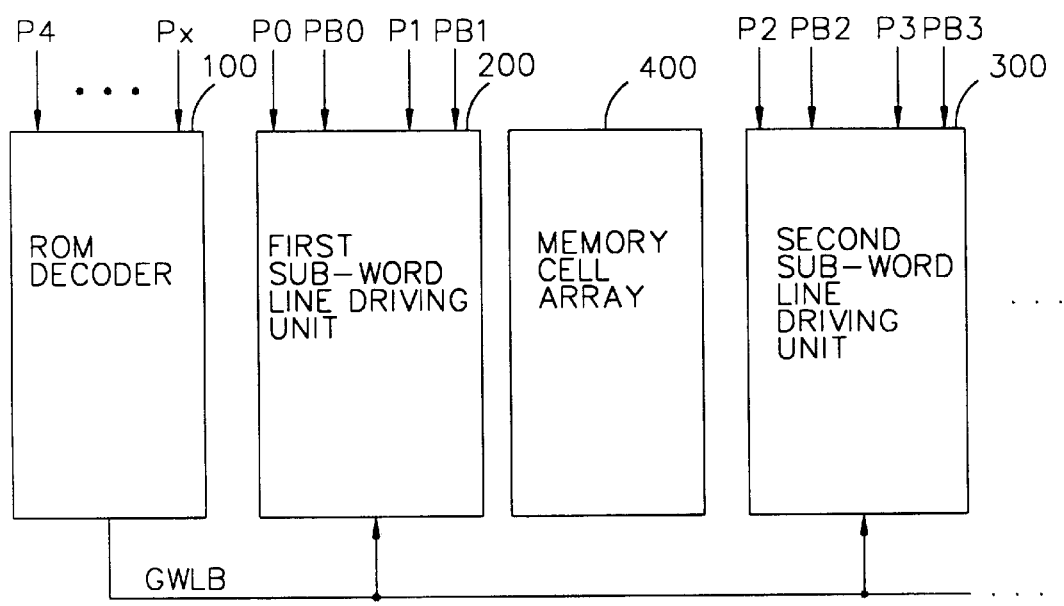
FIG. 3 is a block diagram illustrating a semiconductor memory device having a sub-word line driving circuit according to the present invention.

FIG. 3 is a block diagram of the semiconductor memory device having the sub-word line driving circuit according to the present invention. As shown in FIG. 3, the semiconductor memory device includes: a row decoder 100 receiving high significant predecoding signals P4–Px obtained by predecoding externally-inputted high significant row address signals and outputting inverted first and second global word line enable signals GWLB0, GWLB1; a first sub-word line driving unit 200 selectively outputting first and second low significant predecoding signals P0, P1 obtained by predecoding externally-inputted low significant row address signals or a ground potential respectively to corresponding sub-word lines SWL0, SWL2, SWL5, SWL7 according to the inverted first and second global word line enable signals GWLB0, GWLB1 and inverted first and second low significant predecoding signals PB0, PB1; a second sub-word line driving unit 300 selectively outputting third and fourth low significant predecoding signals P2, P3 obtained by predecoding externally-inputted low significant row address signals or a ground potential respectively to corresponding sub-word lines SWL1, SWL3, SWL4, SWL6 according to the inverted first and second global word line enable signals GWLB0, GWLB1 and inverted third and fourth low significant predecoding signals PB2, PB3; and a memory cell array 400 having a plurality of memory cells storing a data or outputting a stored data through bit lines BL0–BL3, a specific sub-word line being enabled according to the first to fourth low significant predecoding signals P0–P3 selectively outputted from the first and second sub-word line driving units 200, 300.

Here, the first and second sub-word line driving units 200, 300 and the memory cell array 400 are provided in a single unit, and may be employed in multiple number, if necessary.

Figure 4:
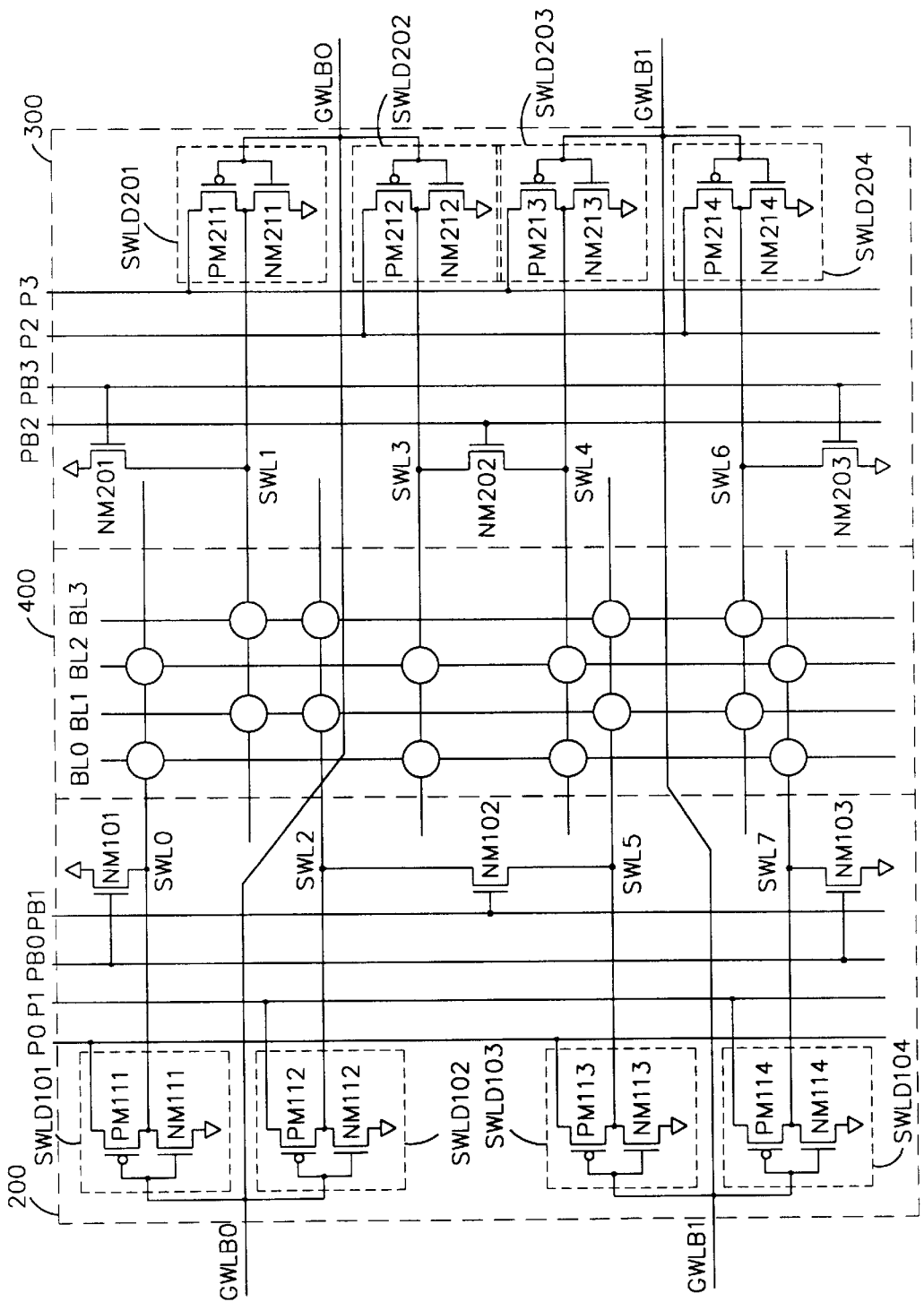
FIG. 4 is a detailed circuit diagram illustrating first and second sub-word line driving units and a memory cell array in the semiconductor memory device in FIG. 3 according to the present invention.

FIG. 4 is a detailed circuit diagram illustrating the first and second sub-word line driving units 200, 300 and the memory cell array 400 which are provided in a single unit in the semiconductor memory device having the sub-word line driving circuit. As illustrated in FIG. 4, the first sub-word line driving unit 200 includes: first to fourth sub-word line drivers SWLD101–SWLD104 selectively outputting the first and second low significant predecoding signals P0, P1 or the ground potential respectively to the corresponding sub-word lines SWL0, SWL2, SWL5, SWL7 according to the inverted first and second global word line enable signals GWLB0, GWLB1; and first to third NMOS transistors NM101–NM103 each connecting the adjacent sub-word lines receiving the identical low significant predecoding signal, the inverted first and second low significant predecoding signals PB0, PB1 being applied to the gates of which. Here, the drains and sources of the first and third NMOS transistors NM101, NM103 are respectively connected to the ground because they are positioned at the end portions of the memory cell array 400.

Here, the sub-word line driver and NMOS transistor may be connected and used in a multiple number.

The first sub-word line driver SWLD101 is an inverter having a PMOS transistor PM111 and an NMOS transistor NM111, the inverted first global word line enable signal GWLB0 being applied to their commonly-connected gate, their commonly-connected drain being connected to the first sub-word line SWL0, the first low significant predecoding signal P0 being applied to a source of the PMOS transistor PM111, a source of the NMOS transistor NM111 being connected to the ground.

The second to fourth sub-word line drivers SWLD102–SWLD104 are identically constituted to the first sub-word line driver SWLD101, and selectively output the first and second low significant predecoding signals P0, P1 or the ground potential respectively to the corresponding sub-word lines SWL2, SWL5, SWL7 according to the inverted first and second global word line enable signals GWLB0, GWLB1.

The second sub-word line driving unit 300 includes the first to fourth sub-word line drivers SWLD201–SWLD204 and the first to third NMOS transistors NM201–NM203 and is identically constituted to the first sub-word line driving unit 200. The second sub-word line driving unit 300 serves to selectively output the third and fourth low significant predecoding signals P2, P3 or the ground potential respectively to the corresponding sub-word lines SWL1, SWL3, SWL4, SWL6 according to the inverted first and second global word line enable signals GWLB0, GWLB1. The first to third NMOS transistors NM201–NM203 receive the identical low significant predecoding signal (P2 or P3), but connect the adjacent sub-word lines receiving different global word line enable signals.

The operation of the semiconductor memory device having the sub-word line driving circuit according to the present invention will now be described in detail with reference to the accompanying drawings.

First, when receiving the high significant predecoding signals P4–Px obtained by predecoding the high significant row address signals, the row decoder 100 decodes the signals and outputs the inverted first and second global word line enable signals GWLB0, GWLB1.

The first to fourth low significant predecoding signals P0–P3 obtained by predecoding the low significant row addresses are applied to the first and second sub-word line driving units 200, 300.

Here, for instance, when the inverted first global word line enable signal GWLB0 outputted from the low decoder 100 is at a low potential and the first predecoding signal P0 is at a high potential, the inverted first predecoding signal PB0 is at a low potential, and thus the first sub-word line SWL0 is selected, thereby allowing the operation of writing or reading a data on the memory cell of the memory cell array 400 to be carried out.

Here, the inverted second global word line enable signal GWLB1 is at a high level, and thus the NMOS transistors NM113, NM114, NM213, NM214 of the third and fourth sub-word line drivers SWLD103, SWLD104, SWLD203, SWLD204 in the first and second sub-word line driving units 200, 300 are turned on. As a result, the first to eighth sub-word lines SWL4–SWL7 are connected to the ground, thus maintaining the data in the memory cells connected thereto.

In addition, when the inverted third predecoding signal PB2 is at a high level, the second NMOS transistor NM202 of the second sub-word line driving unit 300 is turned on, and thus the fourth sub-word line SWL3 is connected to the fifth sub-word line SWL4 connected to the ground. Accordingly, the fourth sub-word line SWL3 is at a low level, the inverted second predecoding signal PB1 is at a high level, and thus the third sub-word line SWL2 is connected to the sixth sub-word line SWL5 connected to the ground. As a result, the third sub-word line SWL2 is also at a low level, the inverted fourth predecoding signal PB3 is at a high level, and thus the first NMOS transistor 201 of the second sub-word line driving unit 300 is turned on. Therefore, the second sub-word line SWL1 is connected to the ground, thereby maintaining the data in the memory cells connected to the second to fourth sub-word lines SWL1–SWL3.

However, the inverted first predecoding signal PB0 is at a low level, and thus the first NMOS transistor NM101 of the first sub-word line driving unit 200 is turned off, thereby enabling the first sub-word line SWL0.

Identically, when the inverted first and second global word line enable signals GWLB0, GWLB1 and the low significant predecoding signals P0–P3 are selected and applied, the required sub-word line can be selected and enabled, thereby making it possible to select a required memory cell from the memory cell array 400 and write or read a data therein.

Figure 5:
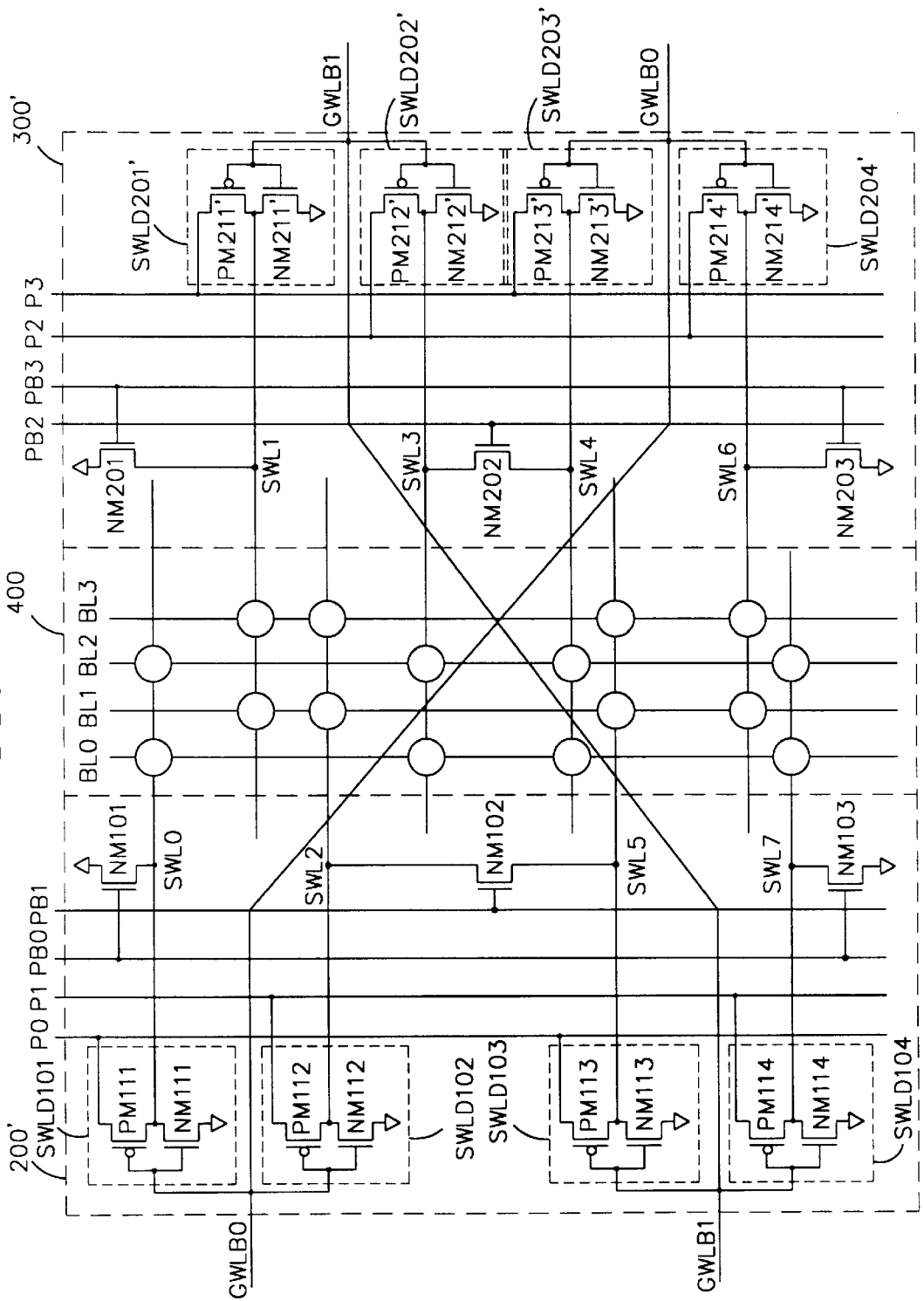
FIG. 5 is a detailed circuit diagram illustrating first and second sub-word line driving units and a memory cell array of the semiconductor memory device according to another embodiment of the present invention.

FIG. 5 is a detailed circuit diagram illustrating first and second sub-word line driving units 200', 300' and a memory cell array 400 formed in a single body according to another embodiment of the present invention, which is almost identically constituted to the abovedescribed ones. However, the inverted first and second global word line enable signals GWLB0, GWLB1 pass through the first sub-word line driving unit 200', cross each other at an intersecting point and are applied to the second sub-word line driving unit 300'.

The operation of the semiconductor memory device with the sub-word line driving circuit according to another embodiment of the present invention will now be described.

The operation thereof is basically identical to that of the above-described one. However, first and second sub-word line drivers SWLD201', SWLD202' of the second sub-word line driving unit 300' are driven by the inverted second global word line enable signal GWLB1, and the third and fourth sub-word line drivers SWLD203', SWLD204' are driven by the inverted first global word line enable signal GWLB0.

The NMOS transistor for connecting the sub-word lines to the ground is provided to every two sub-word lines, thereby reducing a chip size and improving integration.

As the present invention may be embodied in several forms without departing from the spirit of essential characteristics thereof, it should also be understood that the abovedescribed embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A semiconductor memory device having a sub-word line driving circuit, comprising:

a plurality of sub-word line driving units each including a plurality of inverters, each receiving at its input a global word line signal from a row decoder being connected to their input terminals, and a predecoding signal obtained by predecoding an external low significant row address signal being connected to their power terminals, with their output terminals being connected to sub-word lines; and a plurality of transistors, a channel of each of which being connected between a respective pair of adjacent sub-word lines receiving an identical decoding signal and a control terminal of each of which the inverters receiving an inverted row decoding signal, and controlled by the inverted row decoding signal.

2. The device of claim 1, wherein the row decoder receives the external address signal, generates the word line signal by a signal obtained by decoding the high significant address signal, and outputs the decoding signal by decoding the low significant address signal.

3. The device of claim 1, wherein the control signal of the transistor is an inverted signal of the decoding signal connected to the power terminal.

4. The device of claim 1, wherein the transistor is an NMOS transistor.

5. A semiconductor memory device having a sub-word line driving circuit comprising:

first and second sub-word line driving units having a plurality of sub-word line drivers each outputting a specific sub-word line driving signal by a word-line signal and a row decoding signal; and a memory cell array selecting a specific memory cell according to output signals from the first and second sub-word line driving units, and storing or outputting a data through bit lines, the first and second units and the memory cell array being alternately arranged in a single unit, the first and second sub-word line driving units including a plurality of sub-word line drivers each having a plurality of inverters, each receiving at its input a global word line signal from a row decoder being connected to their input terminals, and a predecoding signal obtained by predecoding a low significant row address signal being connected to their power terminals, with their output terminals being connected to sub-word lines, and the plurality of sub-word line drivers each including a plurality of transistors, a channel of each of which being connected between a respective pair of adjacent sub-word lines receiving an identical decoding signal and different global word line enable signals, and controlled by the inverted decoding signal inputted to the sub-word line driver.

6. The device of claim 5, wherein the inverter includes a PMOS transistor and an NMOS transistor, a commonly-connected gate of which forming an input terminal, a commonly-connected drain of which forming an output terminal, sources of which being connected respectively to the decoding signal and the ground power.

* * * * *